(12) United States Patent
Lai et al.

(10) Patent No.: US 8,883,650 B2
(45) Date of Patent: Nov. 11, 2014

(54) METHOD OF REMOVING OXIDES

(75) Inventors: Kuo-Chih Lai, Tai-Nan (TW); Yi-Wei Chen, Tai-Chung Hsien (TW); Nien-Ting Ho, Tainan (TW); Teng-Chun Tsai, Hsin-Chu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 1457 days.

(21) Appl. No.: 12/018,806

(22) Filed: Jan. 24, 2008

(65) Prior Publication Data
US 2009/0191714 A1   Jul. 30, 2009

(51) Int. Cl.
*H01L 21/302* (2006.01)

(52) U.S. Cl.
USPC .............. 438/714; 438/715; 438/723; 216/74

(58) Field of Classification Search
USPC ........ 216/58, 72, 94; 438/715, 716, 706, 700, 438/714, 723; 257/E21.219; 156/345.52, 156/345.53
See application file for complete search history.

(56) References Cited

U.S. PATENT DOCUMENTS

| | | | |
|---|---|---|---|
| 6,706,334 B1 * | 3/2004 | Kobayashi et al. | 427/534 |
| 7,105,101 B2 | 9/2006 | Shinriki | |
| 2002/0045355 A1 | 4/2002 | Chong | |
| 2004/0266214 A1 * | 12/2004 | Suguro et al. | 438/771 |
| 2005/0087893 A1 * | 4/2005 | Chung et al. | 257/E21.311 |
| 2005/0230350 A1 | 10/2005 | Kao | |
| 2006/0051966 A1 * | 3/2006 | Or et al. | 438/706 |
| 2006/0214257 A1 * | 9/2006 | Ninomiya et al. | 257/502 |
| 2007/0281496 A1 * | 12/2007 | Ingle et al. | 438/778 |
| 2008/0078743 A1 * | 4/2008 | Munoz et al. | 216/58 |

FOREIGN PATENT DOCUMENTS

TW   402782   8/2000
TW   I268537   12/2006

* cited by examiner

*Primary Examiner* — Lan Vinh
(74) *Attorney, Agent, or Firm* — Winston Hsu; Scott Margo

(57) ABSTRACT

The present invention provides a method of removing oxides. First, a substrate having the oxides is loaded into a reaction chamber, which includes a susceptor setting in the bottom portion of the chamber, a shower head setting above the susceptor, and a heater setting above the susceptor. Subsequently, an etching process is performed. A first thermal treatment process is then carried out. Finally, a second thermal treatment process is carried out, and a reaction temperature of the second thermal treatment process is higher than a reaction temperature of the first thermal treatment process.

18 Claims, 4 Drawing Sheets

METHOD OF REMOVING OXIDES

BACKGROUND OF THE INVENTION

1. Field of the Invention

The present invention relates to a method of removing oxides, and more particularly, to a method of effectively removing oxides and with improved salicidation capability.

2. Description of the Prior Art

In the fabrication of semiconductor integrated circuits, a metal-oxide-semiconductor (MOS) transistor is fabricated by forming a gate structure on a semiconductor substrate first. Lightly doped drain (LDD) regions are then formed within the substrate on the two corresponding sides of the gate structure. Next, spacers are formed on the sidewalls of the gate structure and an ion implantation process is performed to form source/drain regions within the substrate by utilizing the gate structure and spacers as a mask. In order to incorporate the gate, source, and drain into the circuit, contact plugs are often utilized for interconnection purposes, in which the contact plugs are composed of conducting metals such as tungsten and copper. Nevertheless, the interconnection between the contact plugs and the silicon material of the gate structure and the source/drain region is usually poor; hence a silicide material is often formed over the surface of the gate structure and the source/drain region to decrease the contact resistance between the contact plugs and the gate structure and the source/drain region.

Today, the process known as self-aligned suicide (salicide) process has been widely utilized to fabricate silicide materials, in which a source/drain region is first formed, a metal layer comprised of cobalt, titanium, or nickel is disposed on the source/drain region and the gate structure, and a rapid thermal annealing (RTA) process is performed to react the metal layer with the silicon contained within the gate structure and the source/drain region to form a metal silicide for reducing the sheet resistance of the source/drain region. In addition, depending on different integrated circuit designs, an oxide layer, such as a resist protecting oxide (RTO), may be deposited on the silicon material before forming the metal layer, and an etching process is performed to remove a portion of the oxide layers, where the metal suicides will be formed, to form a patterned salicide block (SAB) to protect a portion of the gate structure and the source/drain region from forming the metal silicides. The patterned salicide block is finally removed.

In the conventional method of removing resist protecting oxide (RTO), a silicon substrate including resist protecting oxide (RPO) is loaded into dry or wet etching apparatus, which contains diluted hydrofluoric acid, for a predetermined time, and the silicon substrate is then moved out. Next, the silicon substrate is transferred into a metal sputtering apparatus for performing a self-aligned silicide (salicide) process. However, it takes longer process queue time for transferring the silicon substrate from the wet etching apparatus to the metal sputtering apparatus; therefore, the process throughput is greatly affected. Besides, the surface of the silicon substrate, where the resist protecting oxide has been removed, may be formed with a native oxide having a thickness of about 4 to 10 angstrom (Å) because of the silicon substrate contacts with oxygen and water in air. As a result, the adhesion capability between the metal layer, which will be formed in the following sputtering process, and the silicon substrate is affected, and then affect the formation of the metal silicide, i.e. the salicidation capability is poor.

Accordingly, there are plenty of patents that have disclosed how to remove native oxides using a dry etching process before the self-aligned silicide (salicide) process. Because the reaction chamber of the dry etching process can be combined with the reaction chamber of the metal sputtering process in one frame (or a vacuum cluster system), thus the contact chance of the silicon substrate, where the native oxides have been removed, with air can be avoided.

However, in the conventional methods of removing native oxides using the dry etching process, as the thickness of the native oxides increase, some residues, which are not etched completely, are found remained on the surface of silicon substrate after the self-aligned silicide (salicide) process. Furthermore, some incomplete metal silicides, where the metal silicide should be formed, are also found. Under the circumstances, the resistance of the integrated circuit is increased.

Accordingly, a method of effectively removing oxides with improved salicidation capability is provided to improve upon the deficiencies from the conventional methods.

SUMMARY OF THE INVENTION

The present invention relates to a method of removing oxides, and more particularly, to a method of effectively removing oxides with improved salicidation capability.

According to the claims of the present invention, a method of removing oxides is provided. First, a substrate having the oxides is loaded into a reaction chamber, which includes a susceptor setting in the bottom portion of the chamber, a shower head setting above the susceptor, and a heater setting above the susceptor. Subsequently, an etching process is performed. A first thermal treatment process is then carried out. Finally, a second thermal treatment process is carried out, and a reaction temperature of the second thermal treatment process is higher than a reaction temperature of the first thermal treatment process.

According to claims of the present invention, a method of removing oxides is further provided. First, a substrate having the oxides is loaded into a first reaction chamber. An etching process is then performed. Next, a first thermal treatment process is carried out. Finally, the substrate is loaded into a second reaction chamber to perform a second thermal treatment process, and a reaction temperature of the second thermal treatment process is higher than a reaction temperature of the first thermal treatment process.

The feature of the present invention is the usage of two thermal treatment processes; namely, a first thermal treatment process is carried out to remove most of the products produced in the etching process, and then a second thermal treatment process with higher temperature is carried out to remove some residues, which are not removed in the first thermal treatment process. Therefore, oxides can be removed effectively, and the salicidation capability of the self-aligned silicide (salicide) process can also be improved. It should be noticed that the methods of removing native oxides according to the present invention may be applied in any process, which has the demand for removing oxides, such as removing native oxides before a self-aligned silicide (salicide) process, removing native oxides in the fabrication of contact plugs. It may be also applied in any process, which has the demand for removing thin oxides or native oxides during or before the fabrication processes, etc.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
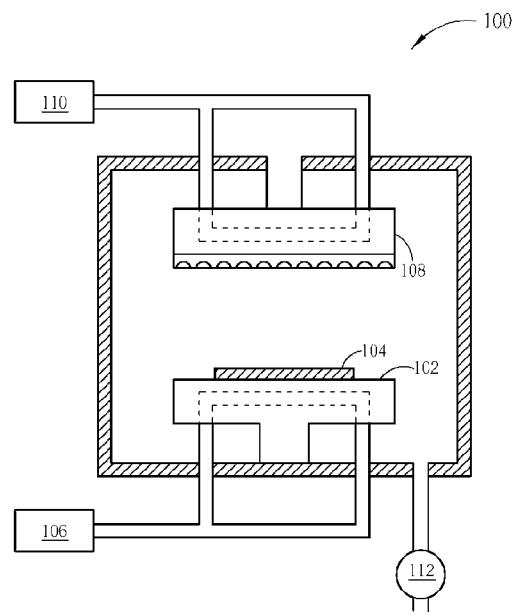
FIG. 1 is cross-sectional diagram illustrating a simplified reaction chamber for removing oxides according to a preferred embodiment of the present invention.

Please refer to FIG. 1, which is a cross-sectional diagram illustrating a simplified reaction chamber for removing oxides according to a preferred embodiment of the present invention. As shown in FIG. 1, a reaction chamber 100 includes a susceptor 102, which is used for placing a substrate 104 (i.e. wafer), setting inside the bottom portion of the reaction chamber 100, and the susceptor 102 further connects to a chiller 106 for cooling the substrate 104 to a predetermined temperature; a shower head 108, which includes a plurality of holes for uniformly dispersing gases flowing into the reaction chamber 100, setting on the top portion inside the reaction chamber 100; a heater 110, which is used for heating the shower head 108 or heating the gases flowed into the shower head 108, connected with the shower head 108.

The chiller 106 utilizes cooling materials, such as cooled water, liquid nitrogen, etc, circulating in a pipe setting inside the susceptor 102 for lowering the temperature of the substrate 104 by thermal exchange. Similarly, the heater 110 may utilizes heating materials, such as heated water, liquids capable of heating, etc, circulating in a pipe setting inside the shower head 108 or utilizes an electric heater directly setting inside the shower head 108 for heating the shower head 108 or the gases flowing into the shower head 108 by thermal conductivity or thermal irradiation. Furthermore, the heater 110 may also be one or a plurality of independent devices, which is set apart from the shower head 108, inside the reaction chamber 100 and above the susceptor 102.

The susceptor 102 further includes a lift means (not shown) for adjusting the distance between the substrate 104 and the shower head 108. Adjusting the distance between the substrate 104 and the shower head 108 controls the temperature of the substrate 104. Namely, while the distance between the substrate 104 and the shower head 108 becomes shorter, the temperature of the substrate 104 becomes higher; while the distance between the substrate 104 and the shower head 108 becomes longer, the temperature of the substrate 104 becomes lower. Besides, the reaction chamber connects to an exhaust system 112 to exhaust the gases or volatile products from the reaction chamber 100.

The aforesaid reaction chamber 100 for removing native oxides further includes other devices, such as a radio frequency generator (RF generator), gas supplying pipes, or gas sources, etc (not shown). The reaction chamber 100 may also combine with the conventional load-lock chamber, transfer chamber, metal sputtering chamber, cooling chamber, heating chamber, etc, in one frame. Those are well known by those skilled in the art, and the details of which are not further explained herein for the sake of brevity.

Figure 2:
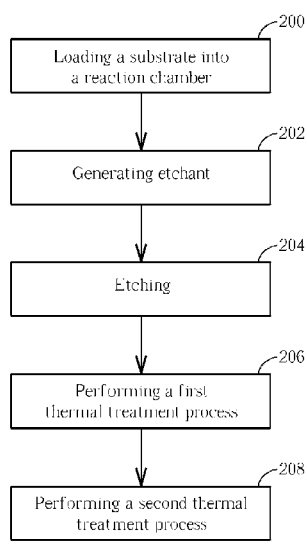
FIG. 2 is a flow chart illustrating a method of removing oxides according to a first preferred embodiment of the present invention.

Please refer to FIG. 2, which is a flow chart illustrating a method of removing native oxides according to a first preferred embodiment of the present invention. As shown in FIG. 2, step 200 is first carried out to load a substrate 104, which includes native oxides needed to be removed, into a reaction chamber 100 as shown in FIG. 1, and to place the substrate 104 on the susceptor 102. The substrate 104 may be a semiconductor substrate or silicon on insulator (SOI) substrate having native oxides on the surface. The substrate 104 may also be any wafer or bare chip in the fabrication of semiconductor integrated circuits.

Next, step 202 is carried out to generate etchant in the reaction chamber 100. Among which, the plasma energy dissociates the ammonia ($NH_3$) and nitrogen trifluoride ($NF_3$) gases, which are introduced into the reaction chamber 100 through the shower head 108, into reactive species that combine to form ammonia fluoride ($NHF_4$) and ammonium hydrogen fluoride ($NH_4F.HF$ or $NH_4HF_2$) compounds. Those two compounds are used as the etchant to etch the native oxides.

Step 204 is then carried out to etch the native oxides on the surface of the substrate 104. Namely, the etchant gas, ammonia fluoride ($NHF_4$) and ammonium hydrogen fluoride ($NH_4F.HF$ or $NH_4HF_2$), reacts with the native oxides on the surface of the substrate 104 to form solid ammonium hexafluorosilicate ($(NH_4)_2SiF_6$) left on the substrate 104. During the etching process, the chiller 106 set inside the susceptor 102 is turned on to maintain the substrate 104 at or under the room temperature.

Subsequently, step 206 is carried out to perform a first thermal treatment process to dissociate or sublimate the solid $(NH_4)_2SiF_6$ into volatile silicon fluoride ($SiF_4$), ammonia ($NH_3$), and hydrogen fluoride (HF) products. These volatile products are then removed from the reaction chamber 100 by the exhaust system 112 connected to the reaction chamber 100. During the first thermal treatment process, the heater 110 is turned on and the chiller 106 is turned off. And the temperature of the surface of the substrate 104 is maintained between about 100° C. to 200° C. by adjusting the distance between the susceptor 102 and the shower head 108. According to a preferred embodiment of the present invention, the distance between the susceptor 102 and the shower head 108 is longer than about 100 mil (1000 mil=1 inch) in the first thermal treatment process, but it is not limited thereto depending on different outputting powers of different hardware apparatuses.

Finally, step 208 is carried out to perform a second thermal treatment process to dissociate or sublimate the residues, which are not removed in the first thermal treatment process, and then to be removed from the reaction chamber 100 by the exhaust system 112 connected to the reaction chamber 100. During the second thermal treatment process, the heater 110 is turned on and the chiller 106 is turned off. The distance between the susceptor 102 and the shower head 108 in the second thermal treatment process is shorter than the distance in the first thermal treatment process in order to maintain the temperature of the surface of the substrate 104 higher than about 250° C., and is preferably about 300° C. to 400° C. According to a preferred embodiment of the present invention, the distance between the susceptor 102 and the shower head 108 is shorter than about 100 mil during the second thermal treatment process, but it is not limited thereto depending on different outputting powers of different hardware apparatuses.

After all processes of removing native oxides have being finished, the substrate 104 is cooled down and is then removed out from the reaction chamber 100 or transferred into another reaction chamber (not shown) in the same vacuum cluster system for other fabrication processes, such as deposition process, etc. This process is well known by those skilled in the art, and the details of which are not further explained herein for the sake of brevity. In the aforesaid first thermal treatment process and the second thermal treatment process, a single gas or a mixing gas selected from hydrogen ($H_2$), nitrogen ($N_2$), and helium (He) may be introduced into the reaction chamber 100 for getting better thermal conductivity capability.

Figure 3:
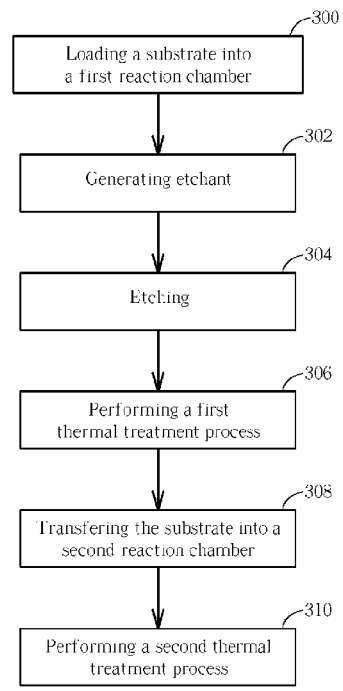
FIG. 3 is a flow chart illustrating a method of removing oxides according to a second preferred embodiment of the present invention.

Please refer to FIG. 3, which is a flow chart illustrating a method of removing native oxides according to a second preferred embodiment of the present invention. The steps 300, 302, 304 as shown in FIG. 3 are all the same with the steps 200, 202, 204 as shown in FIG. 2, respectively.

After the etching process of step 304, step 306 is subsequently carried out to perform a first thermal treatment process in the reaction chamber 100 with the same purpose of the step 206 to dissociate or sublimate the solid $(NH_4)_2SiF_6$ into volatile silicon fluoride ($SiF_4$), ammonia ($NH_3$), and hydrogen fluoride (HF) products. These volatile products are then removed from the reaction chamber 100 by the exhaust system 112 connected to the reaction chamber 100. Similarly, during the first thermal treatment process, the heater 110 is turned on and the chiller 106 is turned off. And the temperature of the surface of the substrate 104 is maintained between about 100° C. to 200° C. by adjusting the distance between the susceptor 102 and the shower head 108.

Step 308 is then carried out to transfer the substrate 104 from the reaction chamber 100 (i.e. the first reaction chamber) to a second reaction chamber. The second reaction chamber may be any reaction chamber having the function of heating—the reaction chamber 100 for removing oxides as shown in FIG. 1 for example. Besides, the second reaction chamber may be combined with the first reaction chamber in a same frame or may be set in another frame without the first reaction chamber. However, it is preferable to use that combined with the first reaction chamber in a same frame, because of preventing the substrate 104 from contacting with oxygen and water in air to form native oxides again.

Finally, Step 310 is carried out to perform a second thermal treatment process to dissociate or sublimate the residues, which are not removed in the first thermal treatment process, and then to be removed from the reaction chamber by the exhaust system connected to the reaction chamber. If the same reaction chamber 100 is used during the second thermal treatment process, the heater 110 is turned on and the chiller 106 is turned off; and the distance between the susceptor 102 and the shower head 108 in the second thermal treatment process is shorter than the distance in the first thermal treatment process in order to maintain the temperature of the surface of the substrate 104 higher than about 250° C., and is preferably about 300° C. to 400° C. However, if only the substrate 104 can be heated to the determined temperature, the reaction chamber used in the second thermal treatment process may be different kinds of the heating reaction chambers with the operation mechanisms, such as radiation, heat exchange, etc. After all processes of removing native oxides have been finished, the substrate 104 is cooled down and is then removed out from the reaction chamber 100 or transferred into another reaction chamber (not shown) in the same vacuum cluster system for another fabrication processes, such as deposition process, etc. This process is well known by those skilled in the art, and the details of which are not further explained herein for the sake of brevity.

Figure 4:
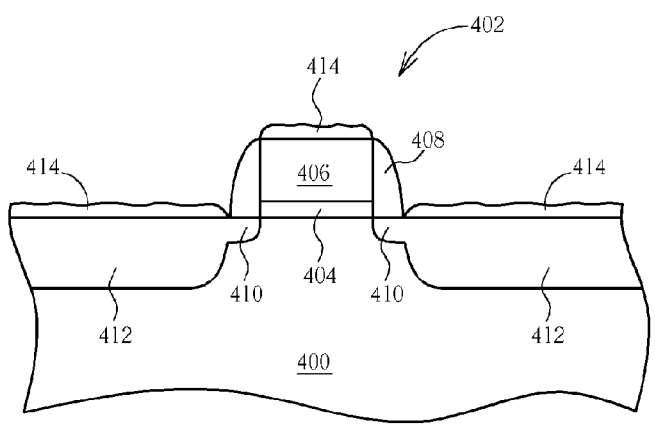
FIG. 4 to FIG. 6 are schematic diagrams illustrating a preferred embodiment of the present invention for removing native oxides.
Figure 5:
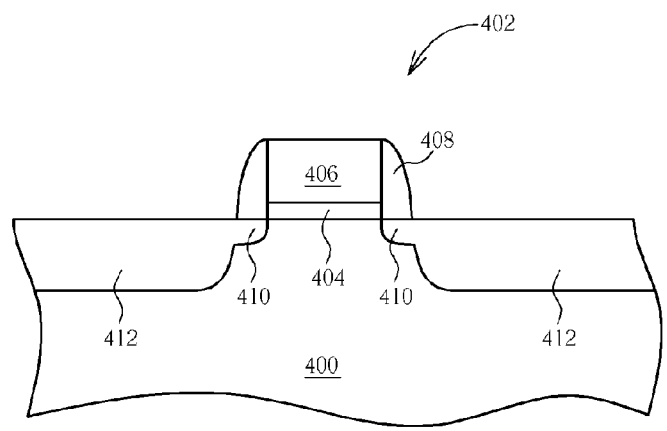
Figure 6:
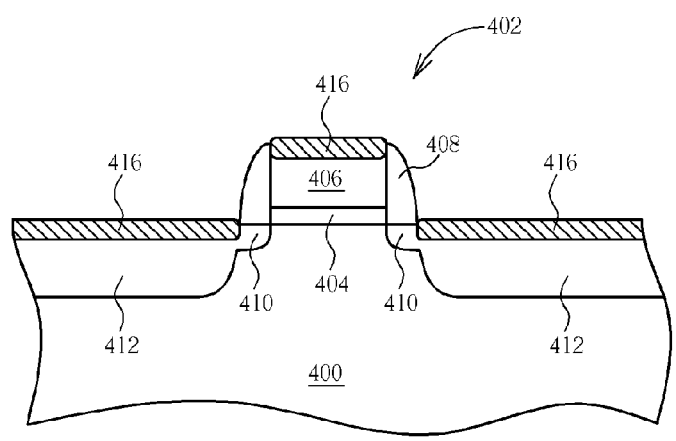

Please refer to FIG. 4 to FIG. 6, which illustrate a preferred embodiment of the present invention for removing native oxides, and the method is applied for removing native oxides before the process of self-aligned silicide (salicide) process. As shown in FIG. 4, at first, a semiconductor substrate 400 is provided such as a silicon substrate or a silicon-on-insulator (SOI) substrate, etc. At least a gate electrode 402 is formed on the semiconductor substrate 400. The gate electrode 402 includes a conductive layer 406, a dielectric layer 404 interposed between the conductive layer 406 and the semiconductor substrate 400, spacers 408 disposed on the sidewalls of the conductive layer 406 and the dielectric layer 404, lightly doped regions 410 positioned within the semiconductor substrate 400 under the spacers 508, and source/drain regions 412 positioned within the semiconductor substrate 400 on the two corresponding sides of the spacers 408 and adjacent to the lightly doped regions 410. In general, the dielectric layer 404 comprises isolating materials such as silicon oxide components, silicon nitride components or high-k dielectric materials, etc; the conductive layer 406 comprises conductive materials such as polysilicon, or metals, etc. Among which, native oxides 414, which are needed to be removed in this embodiment, are formed on the surface of the silicon substrate of the conductive layer 406 and the source/drain regions 412 because the silicon substrate of the conductive layer 406 and the source/drain regions react with oxygen and water in air.

Next, the steps as shown in FIG. 2 or FIG. 3 are carried out to obtain the gate 402, in which the native oxides 414 have been removed, as shown in FIG. 5. Afterward, as shown in FIG. 6, a self-aligned silicide (salicide) process is performed to form metal suicides 416 disposed on the conductive layer 406 and the source/drain region 412 of the gate electrode 402 for the usage in the following processes.

Figure 7:
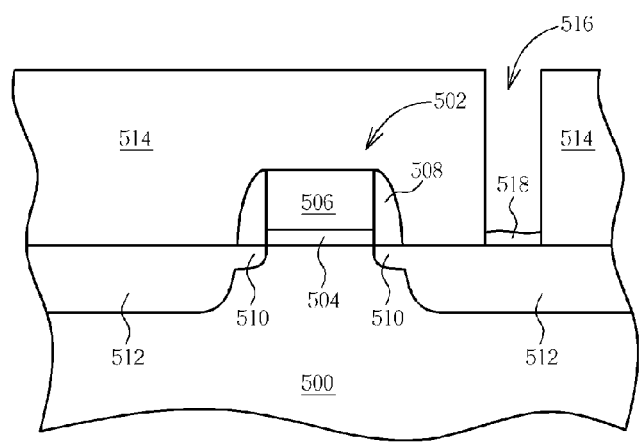
FIG. 7 to FIG. 8 are schematic diagrams illustrating another preferred embodiment of the present invention for removing native oxides.
Figure 8:
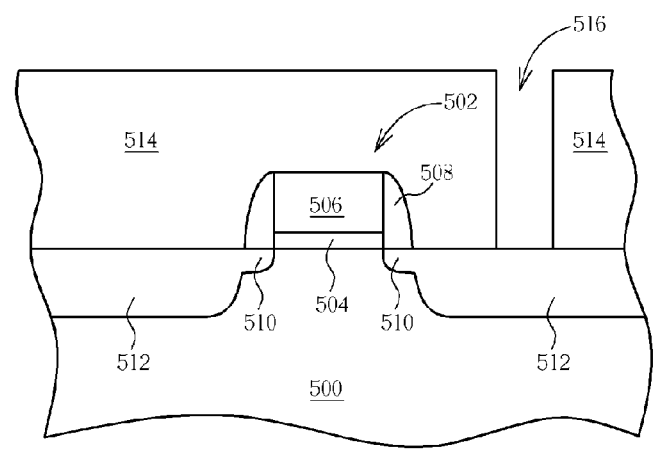

Please refer to FIG. 7 to FIG. 8, which illustrates another preferred embodiment of the present invention for removing native oxides, and the method is applied for removing native oxides in the contact plug process. As shown in FIG. 7, a semiconductor substrate 500, gate electrode 502, dielectric layer 504, conductive layer 506, spacers 508, lightly doped regions 510, and source/drain regions 512 are all the same with the semiconductor substrate 400, gate electrode 402, dielectric layer 404, conductive layer 406, spacers 408, lightly doped regions 410, and source/drain regions 412 as shown in FIG. 4.

Afterward, an interlayer dielectric layer (ILD layer) 514 is formed on the semiconductor substrate 500 and covers the gate electrode 502. The dielectric layer (ILD layer) 514 may be a single layer composed of an oxide layer or a low-k dielectric layer. The dielectric layer (ILD layer) 514 may also be a multiple layer composed of a random combination of a oxide layer, a low-k dielectric layer, a barrier layer, or an etching stop layer, etc. At least a contact plug 516 is then formed within the interlayer dielectric layer 514 to expose a portion of the source/drain regions 512 by photolithography and etching processes. Among which, native oxides 518, which are needed to be removed in this embodiment, are formed on the surface of the silicon substrate within the contact plug 516 as a result of the portion of the silicon substrate within the contact plug 516 reacting with oxygen and water in air.

Next, the steps of removing native oxides as shown in FIG. 2 or FIG. 3 are carried out to obtain the contact plug 516, in which the native oxides 518 have been removed as shown in FIG. 8, for putting to use in the following processes. It should be noticed that during the step of removing the native oxides, a portion of the interlayer dielectric layer (ILD layer) might also be removed. But the removed amount is very few, about several angstroms (Å) to dozens of angstroms (Å), for example. Therefore, that will not affect the following processes or the expected structure.

The feature of the present invention is the usage of two thermal treatment processes; namely, a first thermal treatment process is carried out to remove most of the products produced in the etching process, and then a second thermal treatment process with higher temperature is carried out to remove some residues, which are not removed in the first thermal treatment process. Therefore, oxides can be removed effectively, and the salicidation capability of the self-aligned silicide (salicide) process can also be improved. It should be noticed that the methods of removing native oxides according to the present invention may be applied in any process, which has the demand for removing oxides, such as removing native oxides before a self-aligned silicide (salicide) process, removing native oxides in the fabrication of contact plugs. It may be also applied in any process, which has the demand for removing thin oxides or native oxides during or before the fabrication processes, etc.

Those skilled in the art will readily observe that numerous modifications and alterations of the device and method may be made while retaining the teachings of the invention.

What is claimed is:

1. A method of removing oxides, comprising:
   forming oxides on a substrate;
   loading the substrate having the oxides into a reaction chamber, the reaction chamber comprising:
      a susceptor setting in the bottom of the reaction chamber used for placing the substrate, and the susceptor having a function of cooling the substrate;
      a shower head setting above the susceptor; and
      a heater setting above the susceptor for heating the substrate;
   performing an etching process after forming the oxides on the substrate;
   performing a first thermal treatment process after the etching process; and
   performing a second thermal treatment process to totally remove the oxides after forming a gate electrode and source/drain regions, a reaction temperature of the second thermal treatment process is higher than a reaction temperature of the first thermal treatment process, wherein the first thermal treatment process and the second thermal treatment process are performed in the same reaction chamber on the same substrate.

2. The method of claim 1, wherein a distance between the heater and the shower head during the second thermal treatment process is shorter than a distance between the heater and the shower head during the first thermal treatment process.

3. The method of claim 1, wherein the heater is set within the shower head.

4. The method of claim 1, wherein in the etching process, etchants are generated in the reaction chamber to react with the oxides to form solid products left on the substrate.

5. The method of claim 1, wherein the susceptor cools the substrate during the etching process.

6. The method of claim 4, wherein during the first thermal treatment process, the reaction temperature is about 100° C. to 200° C. for sublimating the solid products to gaseous products, and the susceptor does not cool the substrate.

7. The method of claim 6, wherein during the second thermal treatment process, the reaction temperature is about 250° C., and the susceptor does not cool the substrate.

8. The method of claim 6, wherein during the first thermal treatment process, at least one or a mixing gas selected from the group consisting of hydrogen, nitrogen, and helium, is introduced into the reaction chamber.

9. The method of claim 7, wherein during the second thermal treatment process, at least one or a mixing gas selected from the group consisting of hydrogen, nitrogen, and helium, is introduced into the reaction chamber.

10. A method of removing oxides, comprising:
    loading a substrate having the oxides into a first reaction chamber;
    performing an etching process by using an etching gas;
    performing a first thermal treatment process after the etching process;
    loading the substrate into a second reaction chamber to perform a second thermal treatment process for completely removing the oxides after forming a gate electrode and source/drain regions, and a reaction temperature of the second thermal treatment process is higher than a reaction temperature of the first thermal treatment process, and the first thermal treatment process and the second thermal treatment process are performed on the same substrate.

11. The method of claim 10, wherein the first reaction chamber comprises:
    a susceptor used for placing the substrate setting in the bottom of the reaction chamber, and the susceptor having a function of cooling the substrate;
    a shower head setting above the susceptor, wherein the shower comprises a plurality of holes for uniformly dispersing gases flowing into the first reaction chamber; and
    a heater setting above the susceptor for heating the substrate.

12. The method of claim 11, wherein the heater is set within the shower head.

13. The method of claim 10, wherein during the etching process, etchants are generated in the reaction chamber to react with the oxides to form solid products left on the substrate.

14. The method of claim 13, wherein the susceptor cools the substrate during the etching process.

15. The method of claim 13, wherein during the first thermal treatment process, the reaction temperature is about 100° C. to 200° C. for sublimating the solid products to gaseous products, and the susceptor does not cool the substrate.

16. The method of claim 15, wherein during the second thermal treatment process, the reaction temperature is about 250° C., and the susceptor dose not cool the substrate.

17. The method of claim 15, wherein during the first thermal treatment process, at least one or a mixing gas selected from the group consisting of hydrogen, nitrogen, and helium, is introduced into the first reaction chamber.

18. The method of claim 16, wherein during the second thermal treatment process, at least one or a mixing gas selected from the group consisting of hydrogen, nitrogen, and helium, is introduced into second the reaction chamber.

* * * * *